United States Patent
Choi et al.

(10) Patent No.: US 10,406,553 B2
(45) Date of Patent: Sep. 10, 2019

(54) PRINTED CIRCUIT BOARD HAVING STRUCTURE FOR PREVENTING COATING LIQUID OVERFLOW

(71) Applicant: ALPS ALPINE CO., LTD., Ota-ku, Tokyo (JP)

(72) Inventors: Younggil Choi, Gwangju (KR); Boseok Seok, Gwangju (KR)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 15/869,645

(22) Filed: Jan. 12, 2018

(65) Prior Publication Data

US 2018/0207673 A1 Jul. 26, 2018

(51) Int. Cl.
*H05K 1/18* (2006.01)
*B05C 11/02* (2006.01)
*H05K 3/00* (2006.01)
*B05C 5/02* (2006.01)
*H05K 3/28* (2006.01)

(52) U.S. Cl.
CPC ............ *B05C 11/02* (2013.01); *B05C 5/0212* (2013.01); *H05K 3/0091* (2013.01); *H05K 3/284* (2013.01); *H05K 2201/09909* (2013.01); *H05K 2201/10977* (2013.01); *H05K 2203/0759* (2013.01)

(58) Field of Classification Search
CPC ......... H05K 1/181; H05K 1/184; H05K 1/111
See application file for complete search history.

(56) References Cited

U.S. PATENT DOCUMENTS 8,110,750 B2 * 2/2012 Inagaki ............... H01L 21/4857
174/260
9,338,889 B2 * 5/2016 Hattori ................. H05K 1/111

FOREIGN PATENT DOCUMENTS

KR 1019980045641 A 10/1998

* cited by examiner

*Primary Examiner* — Jeremy C Norris
(74) *Attorney, Agent, or Firm* — Hunton Andrews Kurth LLP (57) ABSTRACT

Disclosed herein is a printed circuit board having a structure for preventing coating liquid overflow. In the printed circuit board on which an electronic component is mounted and in which a connection hole for joining the electronic component and another component to each other is formed, a land region to which lead may be applied is formed adjacent to the connection hole.

8 Claims, 6 Drawing Sheets

PRINTED CIRCUIT BOARD HAVING STRUCTURE FOR PREVENTING COATING LIQUID OVERFLOW

CLAIM OF PRIORITY

This application claims benefit of Korean Patent Application No. 10-2017-0013031 filed on Jan. 26, 2017, the entire contents of which is incorporated herein by reference.

BACKGROUND OF THE DISCLOSURE

1. Field of the Disclosure

Embodiments of the present disclosure relate to a printed circuit board, and more particularly, to a printed circuit board having a structure for preventing coating liquid overflow.

2. Description of the Related Art

Figure 2:
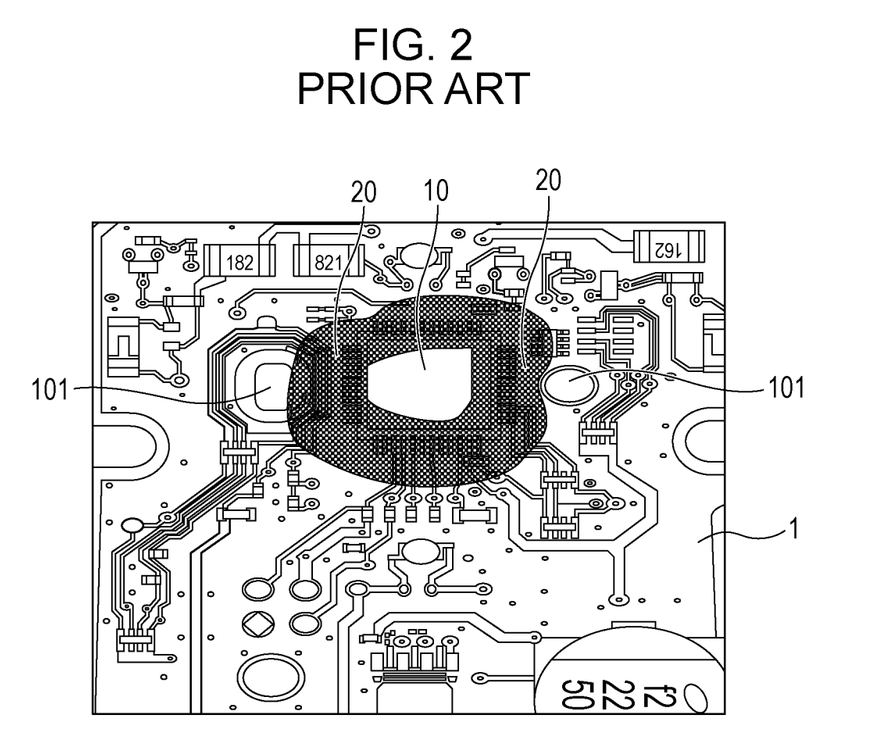
FIG. 2 is a photograph illustrating a state in which the coating liquid has permeated into a connection hole after the coating liquid was applied to the printed circuit board according to the related art.

In a conventional printed circuit board (PCB), there is the possibility that a short-circuit will be generated due to ion migration (a lead growth phenomenon) in the printed circuit board in a high temperature and high humidity environment. In order to solve such a problem, liquid coating may be performed on the region surrounding a terminal 11 of an electronic component 10, as illustrated in FIG. 2.

Meanwhile, there are a region in which coating is required and a coating prohibited region in the printed circuit board.

Figure 1A:
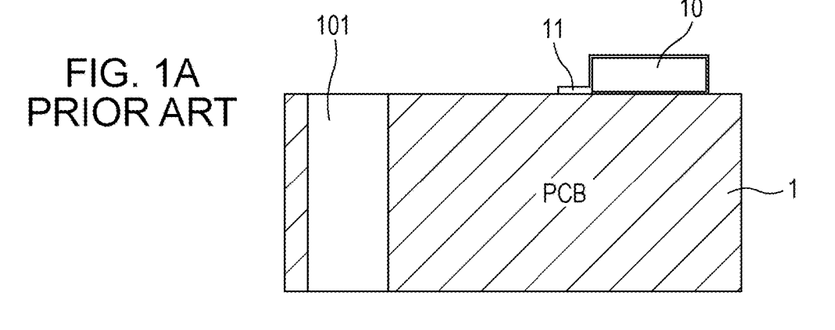
FIGS. 1A to 1C are views illustrating processes of applying a coating liquid to a printed circuit board according to the related art and then joining an electronic component to another component.
Figure 1B:
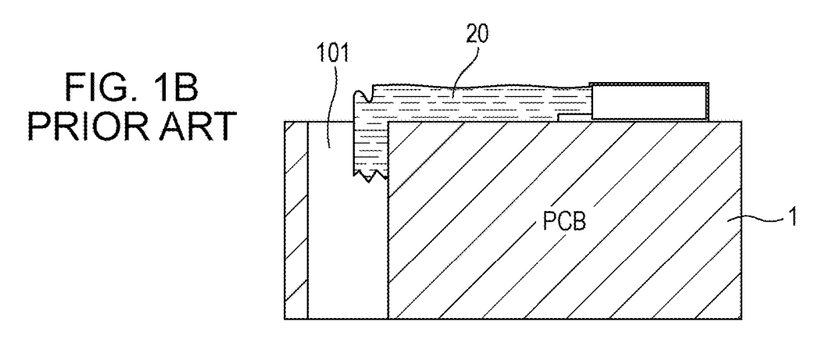
Figure 1C:
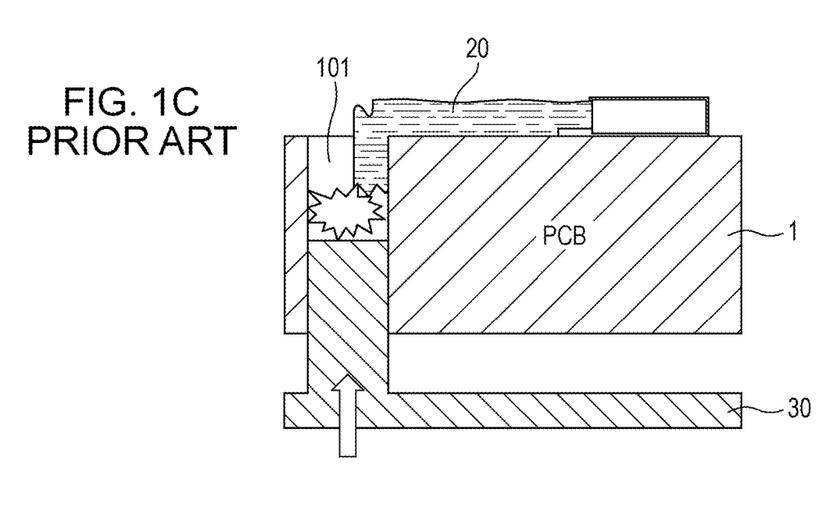

For example, as illustrated in FIGS. 1A to 1C, in the case in which the electronic component 10 needs to be joined to another component 30, liquid coating should not be performed on a connection hole 101 used for the joining.

However, in the conventional printed circuit board 1, as illustrated in FIGS. 1A to 1C, a coating liquid 20 may permeate into the connection hole 101.

Then, in the case in which the coating liquid 20 that has permeated into the connection hole 101 hardens, the hardened coating liquid 20 may hinder the electronic component 10 from being joined to another component 30 and cause a joining defect, as illustrated in FIG. 1C.

An example of the electronic component 10 to which the coating liquid 20 is applied may be a micro control unit (MCU).

The micro control unit may be mounted on the printed circuit board 1 be disposed at the center of the printed circuit board 1 in order to enhance resistance against noise input from the outside.

In addition, in the printed circuit board on which the micro control unit is mounted, one or more connection holes 101 are formed in order to join the micro control unit and another component to each other, and it is difficult to secure a sufficient spacing distance from the terminal 11 of the micro control unit 10.

Therefore, as described above, a situation in which the coating liquid 20 permeates into the connection hole 101 in a process of applying the coating liquid 20 has frequently occurred.

Therefore, a technology for a switch capable of solving the problem in the related art is required.

Korean Patent Laid-Open Publication No. 10-1999-0007742 (published on Jan. 25, 1999) is an example of the related art.

SUMMARY OF THE DISCLOSURE

Embodiments of the present disclosure provide a printed circuit board having a structure capable of preventing a coating liquid from permeating into a connection hole after the coating liquid is applied, in the printed circuit board on which an electronic component is mounted and in which the connection hole for joining the electronic component and another component to each other is formed.

According to an example, there is provided a printed circuit board on which an electronic component is mounted and in which a connection hole for joining the electronic component and another component to each other is formed. In the printed circuit board, a land region to which lead is to be applied is formed adjacent to the connection hole.

A coating liquid may be applied to a terminal of the electronic component.

The land region may be formed in a direction so as to face the electronic component disposed adjacent to the connection hole.

A width of the land region may be 50 to 100% of a height of the electronic component disposed adjacent to the connection hole.

The land region may be formed so as to surround an outer periphery of the connection hole.

The land region may be formed so as to be spaced apart from an outer periphery of the connection hole by 0.1 to 1.0 mm.

A protrusion portion having a predetermined height may be formed by applying lead to the land region.

The protrusion portion may be formed in a direction so as to face the electronic component disposed adjacent to the connection hole.

A height of the protrusion portion may correspond to a height of the electronic component disposed adjacent to the connection hole.

An inclined portion that is inclined toward the connection hole in a side cross section may be formed in the protrusion portion.

As described above, according the printed circuit board of the present invention, the land region to which lead may be applied is formed adjacent to the connection hole, and the structure that may limit the flow of the coating liquid is formed in the land region, such that the printed circuit board having the structure that may prevent the coating liquid from permeating into the connection hole after the coating liquid is applied may be provided.

In addition, according to the printed circuit board of the present disclosure, the land region and the protrusion portion are disposed at specific positions, such that the structure that may limit the flow of the coating liquid may be formed while efficiently utilizing the area of the printed circuit board. As a result, the printed circuit board in which it is possible to effectively prevent the coating liquid from permeating into the connection hole after the coating liquid is applied may be provided.

In addition, according to the printed circuit board of the present disclosure, the width of the land region is limited to a specific range and a position of the land region is limited to a specific position, such that the structure that may limit the flow of the coating liquid may be formed while efficiently utilizing the area of the printed circuit board. As a result, the printed circuit board in which it is possible to effectively prevent the coating liquid from permeating into the connection hole after the coating liquid is applied may be provided.

In addition, according to the printed circuit board of the present disclosure, the height of the protrusion portion is limited to a specific range, and the shape of the protrusion portion in a side cross section is configured to have a specific form, such that the structure that may limit the flow of the coating liquid may be formed while efficiently utilizing the area of the printed circuit board. As a result, the printed circuit board in which it is possible to effectively prevent the coating liquid from permeating into the connection hole after the coating liquid is applied may be provided.

DETAILED DESCRIPTION OF THE DISCLOSURE

The following description is intended to convey a thorough understanding of the embodiments described by providing a number of specific embodiments and details involving a printed circuit board. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Hereinafter, an embodiment of the present disclosure will be described in detail with reference to the drawings. Terms and words used in the present specification and claims are not to be construed as having general or dictionary meanings, but are to be construed as having meanings and concepts in line with the technical spirit of the present invention.

Throughout the present disclosure, when any member is referred to as being positioned "on" another member, it includes not only a case in which any member and another member are in contact with each other, but also a case in which another member is interposed between any member and another member. Throughout the present specification, "including" any component will be understood to imply the inclusion of other components rather than the exclusion of other components, unless explicit description is made to the contrary.

Figure 3:
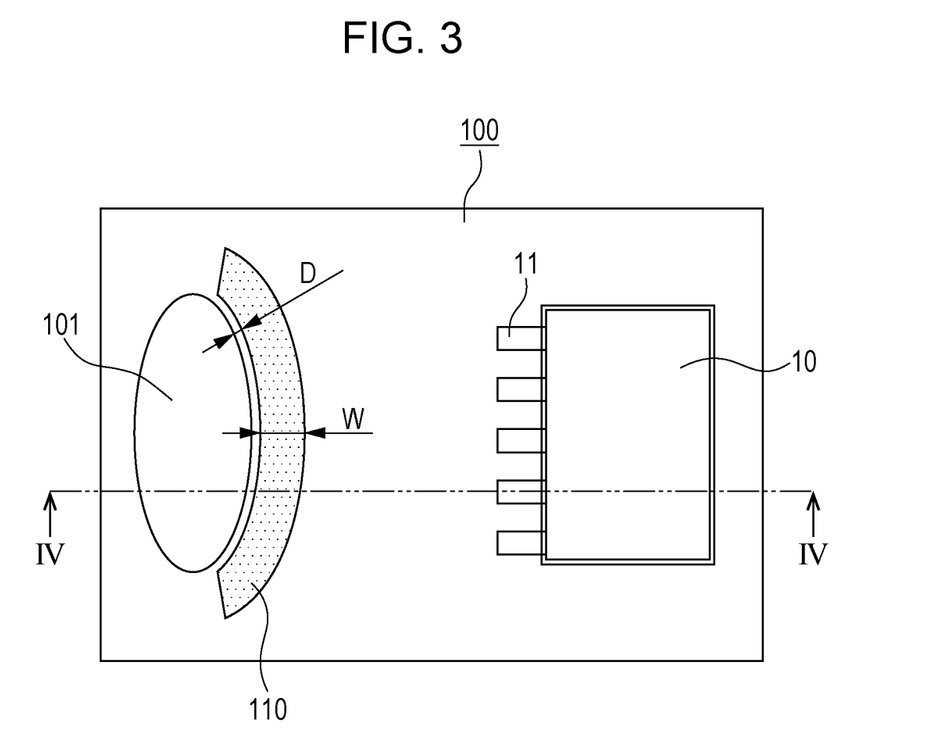
FIG. 3 is a plan view illustrating a printed circuit board according to an embodiment of the present invention.
Figure 4:
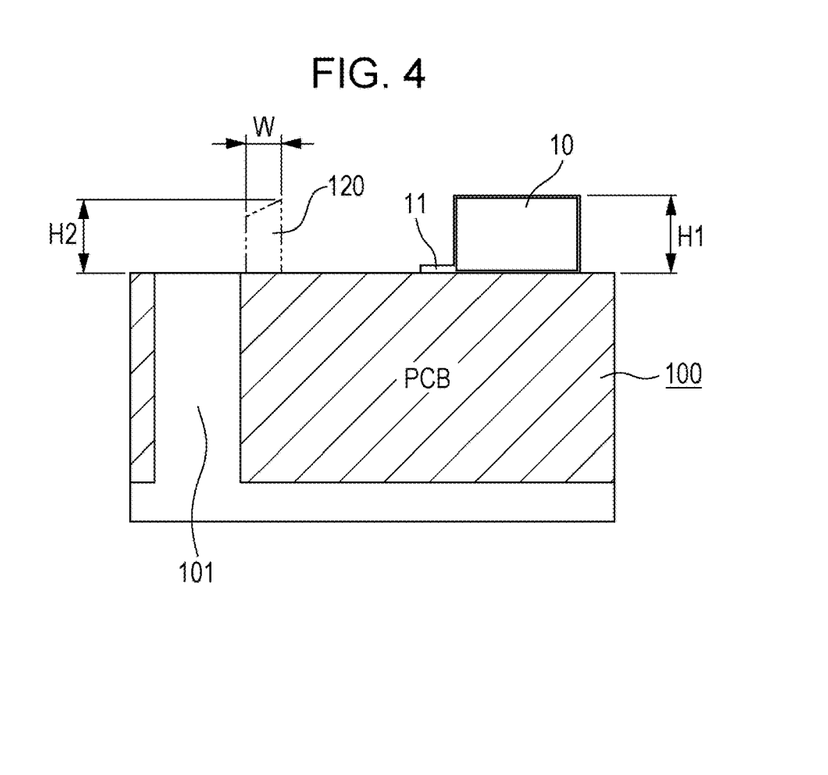
FIG. 4 is a cross-sectional view taken along line IV-IV of FIG. 3.

FIG. 3 is a plan view illustrating a printed circuit board according to an example of the present disclosure, and FIG. 4 is a cross-sectional view taken along line IV-IV of FIG. 3. In addition, FIG. 5 is a side cross-sectional view illustrating a form in which a coating liquid is applied to the printed circuit board according to an example of the present disclosure.

Figure 5:
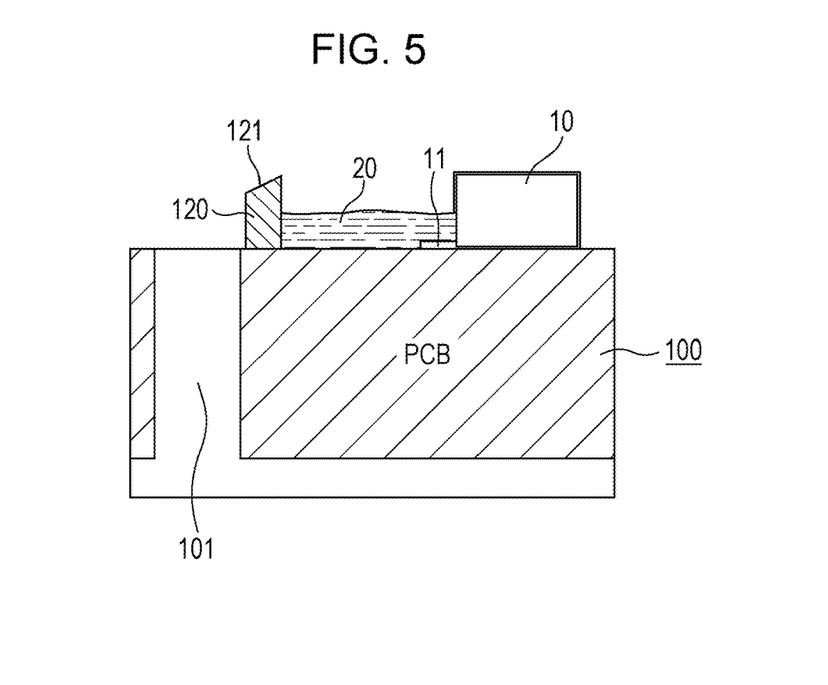
FIG. 5 is a side cross-sectional view illustrating a form in which a coating liquid is applied to the printed circuit board according to the embodiment of the present invention.

Referring to FIGS. 3 to 5, the printed circuit board 100 may have a structure in which an electronic component 10 is mounted thereon and a connection hole 101 for joining the electronic component 10 and another component 30 to each other is formed therein, and may have a structure in which a land region 110 to which lead may be applied is formed adjacent to the connection hole 101, as illustrated in FIG. 3.

A coating liquid 20 may be applied to terminals 11 of the electronic component 10 mounted on the printed circuit board 100 according to the present disclosure, and a short-circuit phenomenon due to ion migration (a lead growth phenomenon) may be prevented.

Lead may be applied to the land region 110, and it is possible to prevent the coating liquid 20 from flowing in an unintended direction using a lead structure applied to the land region 110.

As illustrated in FIG. 3, the land region 110 may be formed so as to surround an outer periphery of the connection hole 101, and the land region 110 may be formed with a predetermined length in a direction so as to face the electronic component 10 disposed adjacent to the connection hole 101 in order to efficiently utilize the area of the printed circuit board 100.

In the case in which a plurality of electronic components 10 mounted on the printed circuit board 100 are disposed adjacent to the connection hole 101, the land region 110 may be formed so as to surround the entire outer periphery of the connection hole 101.

The lead structure may be formed in the land region 110 so as to prevent permeation of the coating liquid 20. To this end, the land region 110 may be spaced apart from the outer periphery of the connection hole 101 by a predetermined distance.

The spacing distance D between the land region 110 and the connection hole 101 described above is not particularly limited as long as it is a distance at which the area of the printed circuit board 100 may be efficiently utilized, and may be, for example, 0.1 to 1.0 mm.

In the case in which the spacing distance D between the land region 110 and the connection hole 101 is set to a length less than 0.1 mm, interference between the electronic component 10 and another component 30 may be generated in a process of joining the electronic component 10 and another component 30 to each other using the connection hole 101, which is not preferable.

On the other hand, in the case in which the spacing distance D between the land region 110 and the connection hole 101 is set to a length exceeding 1.0 mm, an area occupied by the connection hole 101 and the land region 110 is significantly increased, such that the area of the printed circuit board 100 is not efficiently used, which is not preferable.

Therefore, according to the printed circuit board 100 of the present disclosure, the land region 110 and a protrusion portion 120 may be disposed at specific positions, such that a structure that may limit a flow of the coating liquid 20 may be formed while efficiently utilizing the area of the printed circuit board 100. As a result, the printed circuit board in which it is possible to effectively prevent the coating liquid 20 from permeating into the connection hole 101 after the coating liquid is applied may be provided.

As described above, lead may be applied to the land region 110 according to the present embodiment to form the protrusion portion 120 having a predetermined height. Since such a protrusion portion 120 forms the lead structure in the land region 110 so as to prevent the permeation of the coating liquid 20, the protrusion portion 120 may be formed in the direction so as to face the electronic component 10 disposed adjacent to the connection hole 101.

In some cases, in the case in which a plurality of electronic components 10 mounted on the printed circuit board 100 are disposed adjacent to the connection hole 101, the protrusion portion 120 may be formed so as to surround the entire outer periphery of the connection hole 101.

Since the protrusion portion 120 according to an example of the present disclosure should be stably formed in the land region 110 so as to be able to prevent the coating liquid 20 from flowing in an unintended direction, it is preferable that a height H2 of the protrusion portion 120 correspond to a height H1 of the electronic component 10 disposed adjacent to the connection hole 101.

Here, in order to improve the structural stability of the protrusion portion 120, the protrusion portion 120 may be formed with a width corresponding to 50 to 100% of the height H1 of the electronic component 10 disposed adjacent to the connection hole 101 in a state in which a width W of the land region 110 is limited to 50 to 100% of the height H1 of the electronic component 10 disposed adjacent to the connection hole 101.

In the case in which the width W of the land region 110 is set to be less than 50% of the height H1 of the electronic component 10, a protruding structure of the protrusion portion 120 is unstable, such that the protrusion portion 120 collapses even with a relatively small external force and thus, does not perform its role, which is not preferable.

On the other hand, when the width W of the land region 110 is set to exceed 100% of the height H1 of the electronic component 10, the land region excessively occupies the area of the printed circuit board 100, which is not preferable.

Therefore, according to the printed circuit board 100 of the present disclosure, the width W of the land region 110 is limited to a specific range and a position of the land region 110 is limited to a specific position, such that the structure that may limit the flow of the coating liquid may be formed while efficiently utilizing the area of the printed circuit board 100. As a result, the printed circuit board in which it is possible to effectively prevent the coating liquid from permeating into the connection hole after the coating liquid is applied may be provided.

In addition, according to the printed circuit board 100 of the present disclosure, the height H2 of the protrusion portion 120 is limited to a specific range, such that the structure that may limit the flow of the coating liquid may be formed while efficiently utilizing the area of the printed circuit board. As a result, the printed circuit board in which it is possible to effectively prevent the coating liquid from permeating into the connection hole after the coating liquid is applied may be provided.

In some cases, as illustrated in FIG. 5, an inclined portion 121 that is inclined toward the connection hole 101 in a side cross section may be formed in the protrusion portion 120.

In this case, the amount of lead used to form the protrusion portion 120 may be reduced, and it is possible to prevent the coating liquid 20 from flowing in an unintended direction. The shape of the protrusion portion 120 in the side cross section described above is only an example, and is not limited thereto.

In addition, according to the printed circuit board 100 of the present disclosure, the shape of the protrusion portion 120 in the side cross section is configured so as to have a specific form, such that the structure that may limit the flow of the coating liquid may be formed while efficiently utilizing the area of the printed circuit board 100. As a result, the printed circuit board in which it is possible to effectively prevent the coating liquid from permeating into the connection hole after the coating liquid is applied may be provided.

Figure 6A:
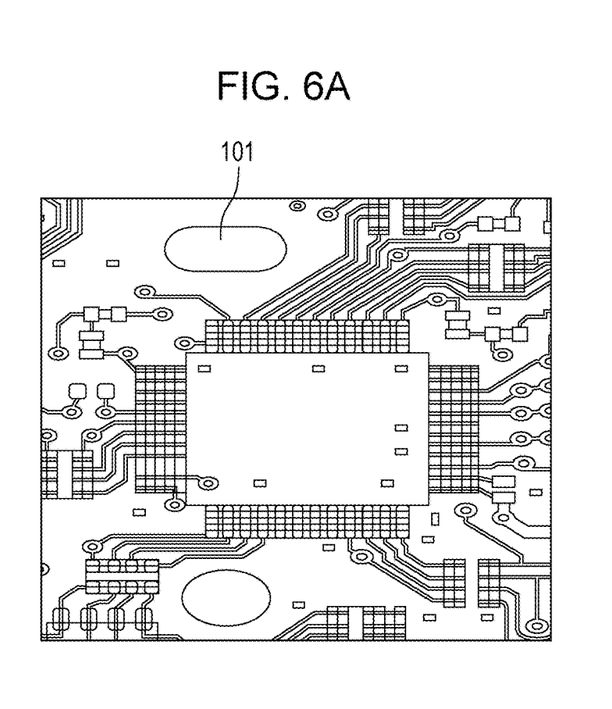
FIGS. 6A and 6B are photographs illustrating the printed circuit board according to the embodiment of the present invention.
Figure 6B:
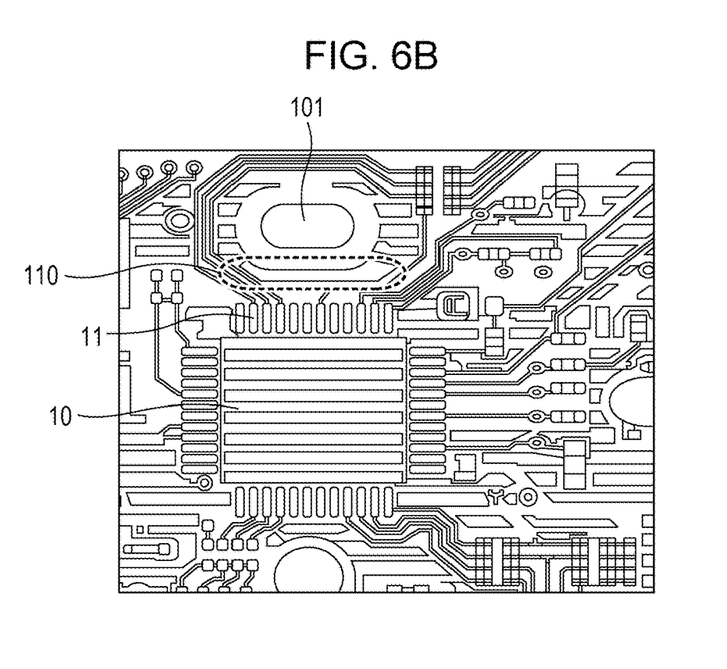
Figure 7:
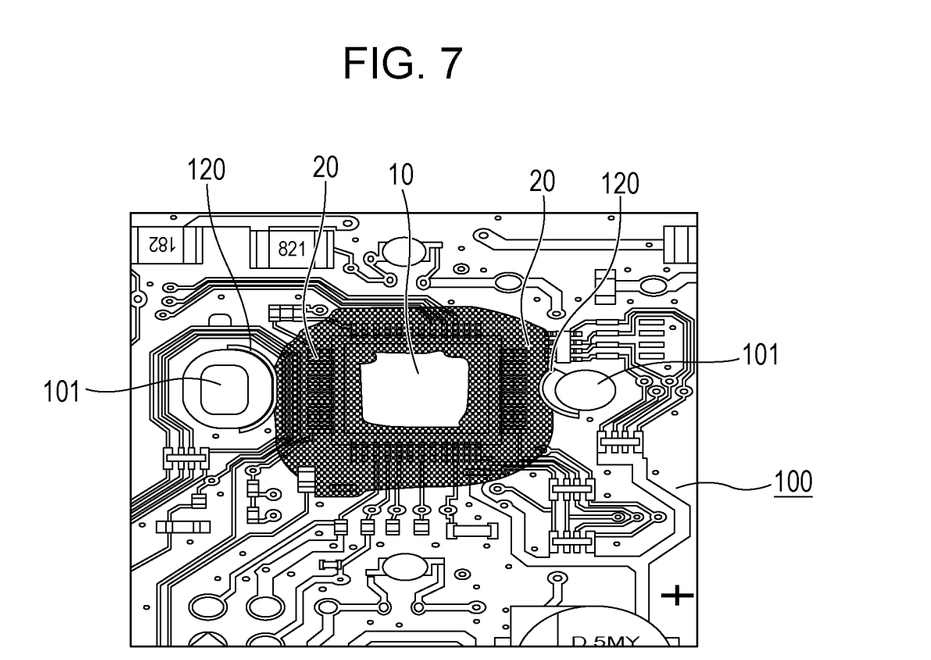
FIG. 7 is a photograph illustrating the form in which the coating liquid is applied to the printed circuit board according to the embodiment of the present invention.

As described above, according to the printed circuit board 100 of the present disclosure, the land region 110 to which lead may be applied may be formed adjacent to the connection hole 101, as illustrated in FIGS. 6A and 6B, and the protrusion portion 120 that may limit the flow of the coating liquid is formed in the land region 110, as illustrated in FIG. 7, such that it is possible to prevent the coating liquid 20 from permeating into the connection hole 101 after the coating liquid 20 is applied.

Hereinabove, an example embodiment of the present disclosure has been described in the detailed description of the present invention. However, it should be understood that the present invention is not limited to a specific form mentioned in the detailed description, and it should be understood that the present invention includes all the modifications, equivalents, and substitutions falling within the spirit and scope of the present invention.

That is, the present invention is not limited to the specific embodiment described above, but may be variously modified by those skilled in the art to which the present invention pertains without departing from the gist of the present invention claimed in the claims, and these modifications are to fall within the scope of the present invention.

Accordingly, the embodiments of the present inventions are not to be limited in scope by the specific embodiments described herein. Further, although some of the embodiments of the present disclosure have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

What is claimed is:

1. A printed circuit board on which an electronic component is mounted and in which a connection hole for joining the electronic component and another component to each other is formed,
   wherein a land region to which lead is to be applied is formed adjacent to the connection hole,
   a coating liquid is applied to a terminal of the electronic component,
   the land region is formed so as to surround an outer periphery of the connection hole, and
   the land region is formed so as to be spaced apart from an outer periphery of the connection hole.
2. The printed circuit board according to claim 1, wherein the land region is formed in a direction so as to face the electronic component disposed adjacent to the connection hole.

3. The printed circuit board according to claim 1, wherein a width of the land region is 50 to 100% of a height of the electronic component disposed adjacent to the connection hole.

4. The printed circuit board according to claim 1, wherein the land region is formed so as to be spaced apart from an outer periphery of the connection hole by 0.1 to 1.0 mm.

5. The printed circuit board according to claim 1, wherein a protrusion portion having a predetermined height is formed by applying lead to the land region.

6. The printed circuit board according to claim 5, wherein the protrusion portion is formed in a direction so as to face the electronic component disposed adjacent to the connection hole.

7. The printed circuit board according to claim 5, wherein a height of the protrusion portion corresponds to a height of the electronic component disposed adjacent to the connection hole.

8. The printed circuit board according to claim 5, wherein an inclined portion that is inclined toward the connection hole in a side cross section is formed in the protrusion portion.

* * * * *